(12) United States Patent
Westcott

(10) Patent No.: US 10,345,775 B2
(45) Date of Patent: Jul. 9, 2019

(54) METHODS AND SYSTEMS FOR INFRASTRUCTURE PERFORMANCE: MONITORING, CONTROL, OPERATIONS, ANALYSIS AND ADAPTIVE LEARNING

(71) Applicant: Brian Westcott, Menlo Park, CA (US)

(72) Inventor: Brian Westcott, Menlo Park, CA (US)

( * ) Notice: Subject to any disclaimer, the term of this patent is extended or adjusted under 35 U.S.C. 154(b) by 116 days.

(21) Appl. No.: 15/229,019

(22) Filed: Aug. 4, 2016

(65) Prior Publication Data

US 2016/0342145 A1 Nov. 24, 2016

Related U.S. Application Data

(63) Continuation-in-part of application No. 15/009,365, filed on Jan. 28, 2016, now abandoned.

(60) Provisional application No. 62/108,928, filed on Jan. 28, 2015.

(51) Int. Cl.
| | |
|---|---|
| *G05B 17/02* | (2006.01) |
| *H04L 29/08* | (2006.01) |
| *G06F 17/50* | (2006.01) |
| *G06N 20/00* | (2019.01) |
| *G06F 9/455* | (2018.01) |

(52) U.S. Cl.
CPC ......... *G05B 17/02* (2013.01); *G06F 9/45533* (2013.01); *G06F 17/5004* (2013.01); *G06N 20/00* (2019.01); *H04L 67/12* (2013.01)

(58) Field of Classification Search
None
See application file for complete search history.

(56) References Cited

U.S. PATENT DOCUMENTS

| | | | |
|---|---|---|---|
| 4,179,940 A | 12/1979 | Oertle et al. | |
| 2008/0059086 A1* | 3/2008 | Duron | G01N 29/12 702/56 |
| 2010/0271199 A1* | 10/2010 | Belov | G01M 5/00 340/539.3 |
| 2012/0283964 A1 | 11/2012 | Berks et al. | |
| 2016/0217226 A1 | 7/2016 | Westcott | |

OTHER PUBLICATIONS

Lau, D., et al. "A cloud-based approach for smart facilities management." Prognostics and Health Management (PHM), 2013 IEEE Conference on. IEEE, 2013.*

Yi, Sun, and Xu Chengwen. "Notice of Retraction The research of Bridge state monitoring system based on IOT technology." Advanced Management Science (ICAMS), 2010 IEEE International Conference on. vol. 3. IEEE, 2010.*

(Continued)

*Primary Examiner* — Aniss Chad
*Assistant Examiner* — Nithya J. Moll
(74) *Attorney, Agent, or Firm* — Wilson Sonsini Goodrich & Rosati

(57) ABSTRACT

A system for measuring, monitoring and controlling the performance of bridges and other infrastructure creates a database for analysis of real time performance and learning through adaptive algorithms allowing the performance to be analyzed over time and for changes in performance against the specific bridge or infrastructure and other bridges or infrastructure in the a network of such infrastructure.

24 Claims, 5 Drawing Sheets

(56) References Cited

OTHER PUBLICATIONS

Watters, David G., et al. "Smart Pebble: Wireless sensors for structural health monitoring of bridge decks." Smart Structures and Materials 2003: Smart Systems and Nondestructive Evaluation for Civil Infrastructures. vol. 5057. International Society for Optics and Photonics, 2003.*

Aktan et al. Development of a model health monitoring guide for major bridges, Report Submitted to Federal Highway Administration Research and Development, 37 pages, (2002).

Catbas et al. Structural health monitoring and reliability estimation: Long span truss bridge application with environmental monitoring data, Engineering Structures 30.9, 2347-2359 (2008).

Chae et al. Development of a wireless sensor network system for suspension bridge health Monitoring, Automation in Construction, 21:237-252 (2012).

Li et al. Fatigue analysis and life prediction of bridges with structural health monitoring data—Part 1: methodology and strategy, International Journal of Fatigue 23.1, 45-53 (2001).

"U.S. Appl. No. 15/009,365 Office Action dated Feb. 7, 2018".

* cited by examiner

METHODS AND SYSTEMS FOR INFRASTRUCTURE PERFORMANCE: MONITORING, CONTROL, OPERATIONS, ANALYSIS AND ADAPTIVE LEARNING

CROSS-REFERENCE TO RELATED APPLICATIONS

This application is a continuation-in-part of application Ser. No. 15/009,365, filed on Jan. 28, 2016, which claims the benefit of Provisional No. 62/108,928, filed Jan. 28, 2015, the full disclosures of which are incorporated herein by reference.

BACKGROUND OF THE INVENTION

1. Field of the Invention

The present invention relates generally to methods and systems for monitoring and controlling bridges, buildings, power transmission, pipelines, tunnels, roadways, and other infrastructure.

Bridge operation is providing the required functionality of capacity and safe, and secure transport over an obstacle connecting two geographical points for the entire life of the bridge in an economical manner.

Bridges are engineered designed structures built out of various materials including metal, concrete, and wood. Bridges are designed to function for a targeted life cycle that is normally about 50 years and designed for a set of operating parameters including level of traffic, weather and other conditions for that specific bridge. The design of a bridge is done so its performance will exceed the greatest required functionality with a factor of safety allowing it to meet the requirements of safe and secure transport for its entire life cycle. In the absence of future information on bridge functionality including changing requirements for capacity and actual use in the future adds additional requirements for a large factor of safety for the design of a bridge. In addition, unknown factors will affect the life of a bridge including impact both minor and major from vehicles or boats colliding with the bridge structure, unknown flaws in construction and unexpected deterioration of materials over the life of the bridge will all add to the difference between performance of the operating bridge and the designed bridge.

Each bridge design is unique, but most are based on standardized design techniques and code requirements for engineering of civil structures. It is difficult to predict the performance of one bridge versus another because the unique design and operating parameters make each bridge a unique entity with regards to performance and operation. Therefore, measurement and prediction of the performance of bridges and other civil structures is very challenging. If real time information about the specific operating conditions of a specific bridge were available along with information about the condition of critical elements of the bridge structure, a better determination of the performance of the specific bridge could be analyzed and the performance and economics of bridge operation improved.

For all these reasons it is desirable to provide methods and systems for providing monitoring, control, operations and analysis on a real time basis in an economical manner for each individual bridge. The methods and systems would provide both central (remote) and local (at the structure) monitoring and control of conditions of individual bridges in real time as those bridges are in use. In addition the system would be able to respond in real time to safety issues and control access to the bridge. Individual analysis over time would allow for adaptive learning of the specific bridge condition and how it is changing based on how it responds to various disturbances and usage. Centralized information, utilizing learning techniques such as statistical pattern recognition, on a set of bridges would allow for operation of the network of bridges to maintain access to the geography the bridges support. Centralized monitoring and control would also improve the economics of bridge operations. Information on a network of bridges in a centralized database would increase the ability to analyze and compare similar bridges and bridges of different design to allow learning across the entire bridge network influencing real time performance and future bridge design.

2. Description of the Background Art

U.S. Pat. No. 4,179,940 describes systems and methods for monitoring bridge performance. U.S. Patent Publ. No. 2012/0283964 describes a wireless stress detector that is used in data gathering networks.

SUMMARY OF THE INVENTION

The present invention provides a three-tier architecture for collecting analog, digital and other sensor measurements associated with large structures, such as bridges. In the first tier, the sensor measurements are processed locally in a plurality of sensor modules coupled to and/or distributed over or near a structure being monitored, particularly highway, river and larger bridges. The raw sensor data is converted to digital form (if necessary), and the digital data is processed and filtered to extract the most useful or valuable information. In this way, the entire raw data set need not be transmitted to the local control units which comprise the second tier of the system One or more local control units are located on or near the structure being monitored and are configured to receive the reduced data sets from the sensor modules and to provide a further level of data processing and extraction before transmitting a further reduced or characterized data set to a remote central unit which comprises the third tier of the system of the present invention. Additionally, the local control units may provide a number of alarm and other local functions which are used directly for control of the bridge. For example, in a bridge monitoring system, the local or "bridge level" control units may provide monitoring and controlling actions based on logic and decisions programmed into the bridge level control unit. The third tier of the system may reside in the "cloud" or alternately in a dedicated remote server where individual bridges are monitored and controlled and analyzed for performance both in the short term and over time. In the cloud or other remote processing and archiving tier, the present invention can provide a real time "dashboard" or other data display for both individual bridges and for the entire network of bridges. Usually, a short term analysis of both individual bridge performance and bridge network performance can also be accessed. Long term analysis of the entire bridge network as well as individual bridges can be provided with an adaptive learning information model.

The methods and systems according to the present invention provide for monitoring, control, and/or analysis of structures such as bridges, buildings, power transmission lines, pipelines, tunnels, roadways, and other infrastructure on a real time basis, using a local and centralized information and control system. Each structure will be provided with a local unit or system that monitors and/or controls the conditions of the structure. The methods and systems of the present invention are particularly suitable for monitoring the bridge conditions including structural integrity (e.g. stress on the structural components), weather conditions, traffic volume, type of traffic, type of use, safety, chemical levels, pollution, radiation levels and the like from sensors located on or near the bridge. The sensor information is measured, filtered, digitized and processed locally in a sensor module then transmitted wirelessly or otherwise to a structure control unit where it can be stored locally then transmitted to the central unit which is typically located remotely from the structure and which usually will be connected to multiple bridges and/or other structures. The systems and methods of the present invention can monitor, control, operate and/or analyze a single structure or a set of structures improving their performance and reducing their lifecycle costs of operation.

With specific reference to bridges, sensor modules may collect structural data representing strain, acceleration, tilt, crack propagation and separation, bridge movement, impacts on the bridge (from collisions with the bridge and/or vehicle collisions on the bridge), weight of bridge traffic, vibrations experience from traffic, weather, or other causes, scour (bridge foundation deterioration), and the like. Sensor modules also may collect safety data, such as bridge icing, vehicle velocity, vehicle flow, human and animal intrusion, bridge lighting, license plate monitoring, and the like. Sensor modules may further collect environmental data, such as wind velocity and direction, temperature including rate of temperature change, precipitation including rate of precipitation, pollution levels, including CO, $CO_2$, $O_3$, radiation levels, chemical exposures, and the like.

Using these measurements the local control unit can determine safe operating conditions by analyzing the measurements against specific functional criteria stored in the controller and/or downloaded from the central information and control. If an out of function condition is determined the local controller can initiate in real time bridge warnings through signs or other transmitted information, access control and traffic metering or total stop of bridge access through warning signs and physical gate or barriers. These alarms would also be transmitted to the central control or determined by the central control and downloaded to the local control.

In a first aspect, the present invention provides a monitoring system which includes a plurality of sensor modules configured to be distributed on or near a complex mechanical structure, such as a bridge, and to transmit data relevant to the bridge or other structure or to an environmental or other condition to which the structure is exposed, e.g. weather, pollution, river flow, earthquakes, as well as usage such as traffic, collisions, and the like. The monitoring system further includes at least one local control unit configured (1) to be located on or near the bridge or other structure and to receive data from the plurality of sensor modules, (2) to process the data received from the plurality of sensor modules, and (3) to transmit the processed data received from the sensor modules. A central unit is configured to receive processed data from the local control unit. The processed data can be archived, analyzed, compiled with similar information from similar structures, and otherwise used to predict future performance of to individual structure as well as of the class of similar structure.

In a first specific embodiment of the system of the present invention, the sensor modules include at least a sensor, a power source, and a communications component. At least some of the sensor modules may further include a processor configured to receive data from the sensor and generate a reduced data set including selected data relating to bridge performance and excluding other data less relevant to bridge performance.

For example, the sensor may be a strain gauge configured to be coupled to a component of the bridge or other structure. The sensor will monitor stress of that structural component many times each second, typically at rate of from 10 to 250 data points per second, usually at 100 data points per second, and the processor is programmed to detect one or more peak stress data point(s) during a window of from one second to six seconds and to transmit one or more of said selected peak data point(s) to the local control unit. The time window is selected to correspond to the expected time of certain stress-inducing events, such as travel of a truck or other heavy vehicle over a bridge. The beginning and the end of the time window may be automatically determined based on an elevation of the observed stress level over a background or average level determined over time.

In another example, the sensor may be a temperature sensor that periodically measures a temperature related to the bridge or other structure. The sensor module transmits a measured temperature to the local control unit only after a threshold change in the measured temperature has occurred. An exemplary threshold change has a value in the range from 0.1° C. to 1° C. The local control unit may include a processor configured to calculate a rate of temperature change based on a value of the temperature threshold change and a time elapsed for the temperature change to occur.

In a still further example, the sensor is an accelerometer configured to be coupled to a bridge component and to monitor movement of that bridge component at a rate of a plurality of times per second, for example of at least 100 data points per second, further comprising detecting one or more peak acceleration or movement data points during a window of one second to six seconds and transmitting said one or more selected peak data point(s) to the local control unit.

In general, the local control units will usually include a processor. The processor in the local control unit may process data received from the sensor modules to generate a reduced data set and transmits the reduced data set to the central unit. Alternatively or additionally, the processor in the local control unit may further process data sets from two or more sensor modules and determine a bridge or other structural status based on the two or more data sets.

The central unit may be a virtual unit residing wholly or partly in the cloud. Alternatively or additionally, the central unit may reside wholly or partly on a remote dedicated server.

In a second aspect, the present invention provides a method for monitoring a bridge or other complex mechanical structure. Data is obtained from a plurality of sensor modules distributed on or near the bridge or other structure The data is sent to a local control unit located on or near the structure and is processed by the local control unit. The processed data is transmitted from the local control unit to a central unit located remotely from the bridge.

In a particular embodiment of the methods of the present invention, the sensor modules include at least a sensor, a power source, and a communications component. Usually, at least some of the sensor modules further include a processor configured to receive data from the sensor and select particular data relating to bridge performance and exclude other data less relevant to bridge performance in the processor to produce a reduced data set.

For example, a strain gauge may be configured to be coupled to a bridge component and to monitor stress of that bridge component at a rate of at least 100 data points per second. By detecting one or more peak stress data points during a window of one second to six seconds and transmitting said one or more selected peak data point(s) to the local control unit, a reduced date set including all necessary strain data may be obtained.

As another example, the sensor may be a temperature sensor and the method may further comprise periodically measuring a temperature related to the bridge or other structure. To limit the amount of data to be transferred, the sensor module controlled will be programmed to transmit a measured temperature to the local control unit only after a threshold change in the measured temperature has occurred. In the exemplary embodiments, the threshold change may have a value from 0.1° C. to 1° C. In a further exemplary embodiment, a processor in the local control unit may calculate a rate of temperature change based on a value of the temperature threshold change and a time elapsed for the temperature change to occur.

Methods according to the present invention may further comprise processing data received from the sensor modules in a processor of the local control unit to generate a reduced data set and transmitting the reduced data set to the central unit. Alternatively or additionally, the processor in the local control unit may further process data sets from two or more sensor modules in the processor of the local control unit in order to determine a bridge status based on the two or more data sets.

Any or all of the data received by and/or generated by the processor in the local control unit may be transmitted to a virtual central unit residing in the cloud. Alternatively, any or all of the data received by and/or generated by the processor in the local control unit may be transmitted to a remote dedicated server.

The measurements are filtered and transmitted from the local control unit to the central control unit or station where they are stored and archived for analysis. The measurements and bridge state will also be displayed for both individual bridges the set of bridges as a whole a user interface. The central controller will also check individual bridge functionality and performance on a real time basis as well as determining or predicting life cycle performance of the bridge and determine the life cycle based on the real updates of use based on actual measurements for the specific bridge. Analysis will use learning techniques to adapt to the unique design and load conditions of each structure. This will reduce the need to individually tailor analysis to each structure and will also have the additional benefit of identifying conditions that would be missed by the detailed analysis that presumes certain operating characteristics. Analysis will also support the need for scheduled maintenance and projected end of life for the bridge.

The central control unit will use software to analyze sets of bridges to determine both short term, medium and long term operating requirements and support optimal scheduling and execution of tasks to improve the performance of the entire bridge system. The short term task such as snow removal, traffic metering on roads, or safety response to emergency such as identification of a vehicle involved in a crime or amber alert. Medium term tasks such as preventive maintenance, bridge light replacement, painting can all be analyzed and coordinated through the central software system to improve overall performance of the bridge. Long term each bridges life cycle will be analyzed for each specific bridge and determined based on levels of usage and measurement of bridge structural integrity and wear. The projected end of life date and safety factor will be determined through bridge structural modeling and engineering.

The health or integrity of an entire set of bridges will be determined and updated. This information can be used to determine replacement and maintenance budgets.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments in which the principles of the invention are utilized and the accompanying drawings of which:

DETAILED DESCRIPTION OF THE INVENTION

Figure 1:
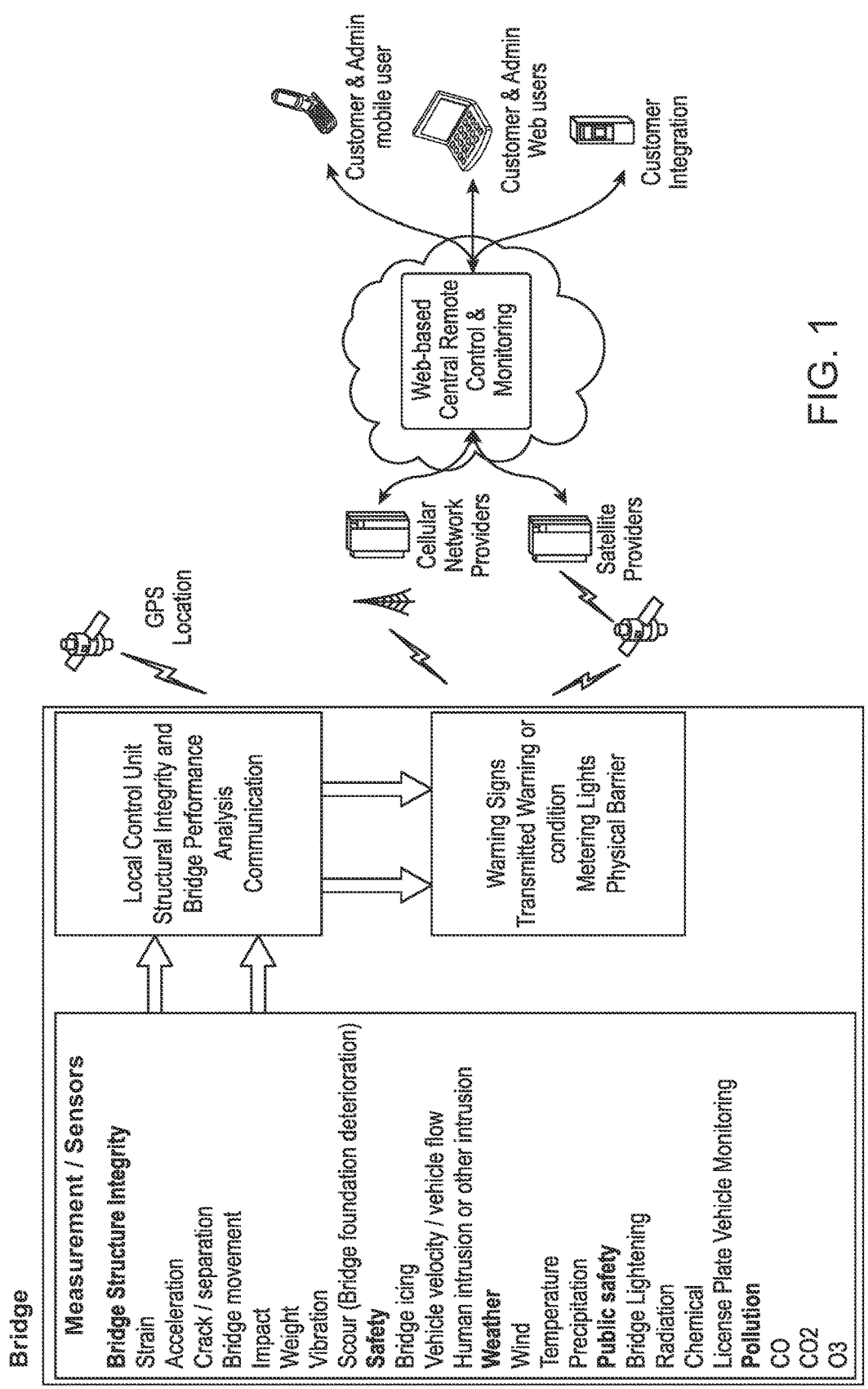
FIG. 1 depicts the main components of a system for measuring, monitoring and controlling the performance of infrastructure and specifically bridges according to the present invention. This system also creates a database for analysis of real time performance and learning through adaptive algorithms allowing the performance to be analyzed over time and for changes in performance against the specific bridge and other bridges in the bridge network.

FIG. 1 depicts the main components of the system. A bridge for transportation is equipped with a local control unit. The local control unit can be permanently installed and fully integrated into the bridge or can be temporarily installed for short term or one time or periodic aligned with scheduled inspections monitoring and testing of the bridge for modeling and determination of bridge integrity ("health"), use and safety.

The local control unit must receive power to operate which is either produced locally through solar, wind of other generating source or obtained by connecting directly to the power grid. This power can also be stored in batteries or devices such as super capacitors for backup. The local control unit interacts with one or many sensors to measure conditions on or near the bridge for structural integrity, safety, weather, traffic, public safety, pollution and other conditions that are useful.

The local control unit can store, analyze, the measurements from the sensors and apply logic to determine local issues and safety concerns as well as transmit the measurements and data to the central remote control and monitoring station. The data could be filtered and combined or analyzed using adaptive algorithms with other data to determine the operating state of the structure.

The local control unit will communicate with local sensors or sensor modules. A local control unit can be a single sensor combined with the features of the local control unit in FIG. 1). A sensor can communicate through a wire, optical fiber or wireless method. A sensor will receive power either directly through cable or through an individual power source such as solar cell or wind generator.

A sensor module will usually include at least one sensor (e.g. a transducer, a camera, a microphone, a thermal sensor, an accelerometer, or the like), a power source and a communication component. The sensor module will usually further include, a GSM or satellite antennae to identify its location, a processor configured to filter and process data from the sensor before being communicated to the local control unit. Optionally, the communication component can be configured to communicate information directly to the central remote monitoring and control station to act as a single node in a bridge performance network.

One issue in wireless networks is the efficient use of available bandwidth. Wireless networks have more limited bandwidth. The sensor module performs both sensor data collection and digitization but additionally it can analyze and process the data to minimize the information sent while still providing an accurate state of the component being measured. Each sensor module can contain software that would determine the critical measurements and information for various sensors and process those measurements through algorithms. An example of such data processing is for strain gauges on a bridge. A strain gage is a common sensor on bridges to determine the characteristics of beam and structural members. A strain gauge is sampled at a high rate, typically up to 200 times a second, to accurately represent the strain of a vehicle such as a truck as it crosses the bridge and applies a force to the strain gauge. The duration of a strain cycle curve, on a component of the bridge can range from 2 seconds to more than 4 seconds. The raw data from this one strain gauge could be over 20,000 bits for the 4 seconds required to represent a single cycle of a truck passing this point. On a basic bridge you could have 50 strain gauges or more transmitting data over the wireless bridge network to the local control unit which in turn would transit the raw data to the cloud through a wireless signal either cellular or satellite. A single day of continuous raw strain gauge data transmission would be 2.6 gigabytes or more of data that requires transmission, processing and storage in the cloud or data center. The "intelligent" sensor modules of the preset invention analyze the raw data to identify the individual points that were valuable to determine the state of the component being measured by the strain gauge. For example, the peak strain from the 400 points measured over the 4 second truck cycle would be reduced to one maximum strain per vehicle cycle that would then be transmitted over the wireless bridge network to the local controller. Using the example of 50 strain sensors measuring strain on a bridge would reduce the data requirements to 3.24 mega-bytes/day of information which is a thousand-fold reduction in both band width requirements and communication cost. This same approach to reducing measurements to valuable information that is specific to the type of measurement and the use of the measurement to determine the state of the particular component or structure could be performed by the "intelligent sensor" module. This approach applies to all the sensors used for structurally monitoring. Such a processing and communications architecture allows implementation of a sufficient number of sensor modules to accurately measure the state of a bridge or other structure while reducing the data load on the system (removing unnecessary data) to allow efficient operation. The necessary and sufficient data can then be transmitted, archived and analyzed to determine bridge performance in a technically and cost effective manner The local control unit is equipped with wireless communication modems and can communicate with a central remote control and monitoring station through publically available communication networks like cellular telephone networks, satellite networks and the internet. An exemplary embodiment supports communication networks through GSM, cellular networks and through the Iridium satellite network and the data would be routed from the cellular network and satellite providers to the central remote control and monitoring station via the public internet.

The local control unit can use data analysis algorithms and processing similar to a sensor module to reduce the data communication through cell and satellite communication to the central unit. For example, a local control unit it could analyze a set of information from many sensor modules to determine the state of the bridge as a whole rather than the stage of an individual component analyzed by a single sensor module. In this mode of operation, the data being sent could be reduced to what is considered necessary an sufficient for monitoring the bridge or other structure as a whole, such as the number of vehicles that crossed the bridge in one hour, the maximum strain observed on certain critical components and/or which exceed some pre-determined minimum (which could take into account data from multiple sensors), or a calculation of the total bridge stress in that hour and the cycles regarding a fatigue life cycle factor experienced by the bridge. The total data transferred would be significantly reduced using this intelligent bridge controller mode of operation.

The local control unit also provides data on a specific bridge to the central system that is used to create a database for analysis of real time performance and learning through adaptive algorithms allowing the performance to be analyzed over time and for changes in performance against the specific bridge and other bridges in the bridge network.

Information from the local unit sent to the central unit would provide local operating conditions that could be correlated with other local bridges and allow information to be sent back to the local bridge. This information flowing in reverse for example could get information from owners about what actions they took on structures and use this to build a system to predict or recommend actions based on a network of bridges each with a local controller. For example, when did the bridge operator apply deicing or resurface the structure.

The local control unit would send information about the conditions of the bridge and measurements of the real time structural integrity, safety, weather, traffic, public safety, pollution and other conditions that are useful and about events it detects to the central remote control and monitoring station at regular intervals and in response to specific events (e.g. bridge collision, bridge physical shift off a bearing, etc). The central remote control and monitoring station can send data and commands back to the local control unit, either in response to a message from the unit or asynchronously as needed. The data from the central remote control and monitoring station can include set points for local control parameters like set points (ex. bridge de-icing heaters) , and operation mode, thresholds for locally detected alarms, and control operation commands (ex: close gate to stop traffic due to bridge structure safety issue), as well as updated or fully new versions of the local control algorithms.

The central remote control and monitoring station can monitor and control many local control units simultaneously. It processes and stores the data sent from the local control units to enhance or filter the original information e.g. sensor measurements, normalization, trends, statistics) detect abnormal conditions through single point measurements (e.g. bridge movement), combination of multiple measurements and logic (e.g. bridge icing measurement, local temperature, local humidity and precipitation combined evaluated through an algorithm), or through a combination of multiple bridge local control data (traffic flow reduction combined with audio and regional weather information or regional river flow to determine accident location and suggested routing information). The central remote control monitoring and control station can detect events of interest, generate reports, and send user notifications and bridge control signals. It provides a user interface that authorized users can access via the public internet, through mobile application or through a web browser, as well as mechanisms to integrate with the back-end applications from multiple partners such as road plowing services, bridge maintenance and repair contractors, local police and fire departments.

The remote central unit (control and monitoring station) can send data and commands to one or more local control units based on a user action automatically in response to some information sent by one of the local control units or based on a command it received from a partner back end application. These user-initiated or automated commands can be based on a number of factors including weather, environmental or safety.

Figure 2:
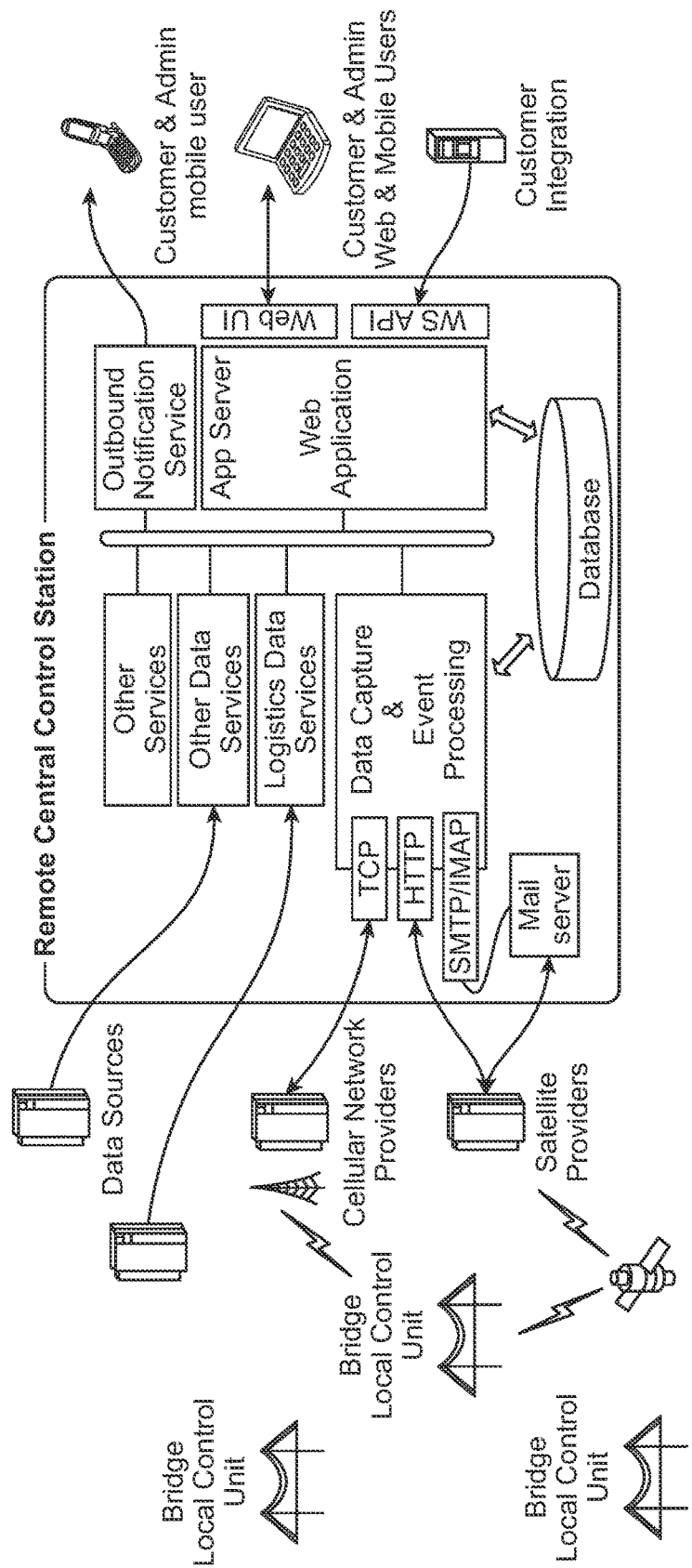
FIG. 2 is a simplified diagram showing an exemplary remote central control station according to the present invention

FIG. 2 illustrates an exemplary cloud-based remote central monitoring and control station useful in the system and methods of the present invention. The remote central control station can be hosted in a provider's or users data center or can reside at least partially in the cloud and will provide a number of data processing components typical of large web-based data control services. A remote central monitoring and control station will receive data from outside data sources, including weather information, traffic information, and the like. The remote central monitoring and control station will also be configured to communicate through all conventional data transmission services including cellular networks, web-based networks, satellite providers, and the like. Such communication links will serve to connect to the local units optional intermediate control units, and other systems. The communication links will also permit communication from users, partners, suppliers and other people involved in the performance of the structures.

Figure 3:
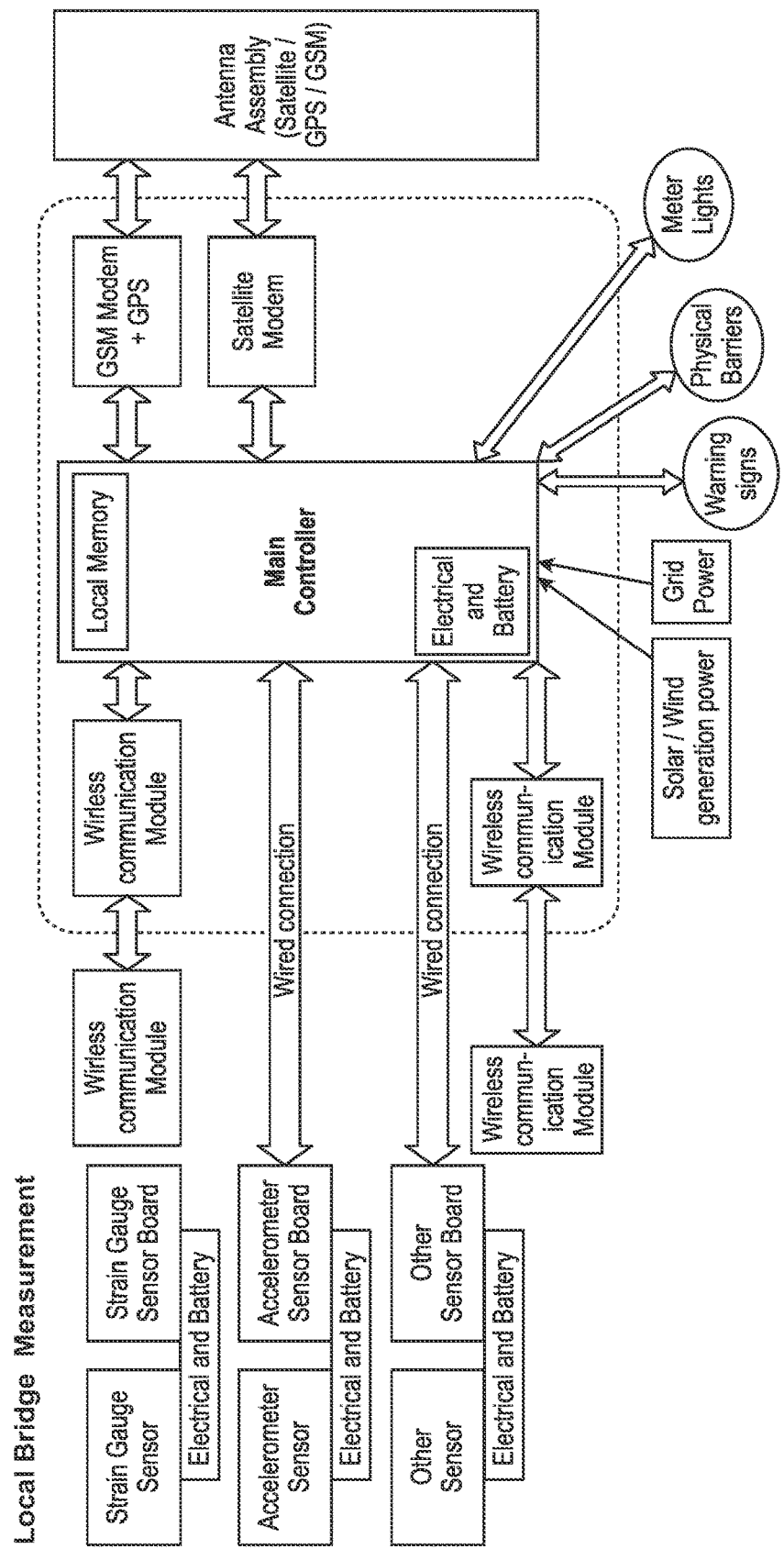
FIG. 3 is a simplified diagram showing an exemplary local control unit according to the present invention

FIG. 3 illustrates an exemplary local control unit which is configured to mount on or near the bridge. The local controller will typically further interface with sensor that measure the bridge structural integrity, bridge safety, environment and weather and other parameters useful to the performance of the bridge. The local controller can act on measurements that indicate problems and send an emergency signal to the central control unit as well as take local action such as turning on a traffic metering light or to lower a gate that restricts traffic from traveling on the bridge. The local monitoring and control unit will also typically include conventional data input and output ports as well as radio devices to allow communication with the external interfaces and in particular to allow communication with the remote central control station and any intermediate control receivers and stations which might be employed. The local unit could also communicate with vehicles directly including conventional and autonomous through a defined interface. The local control unit will include a GPS receiver to notify and track its position.

Figure 4:
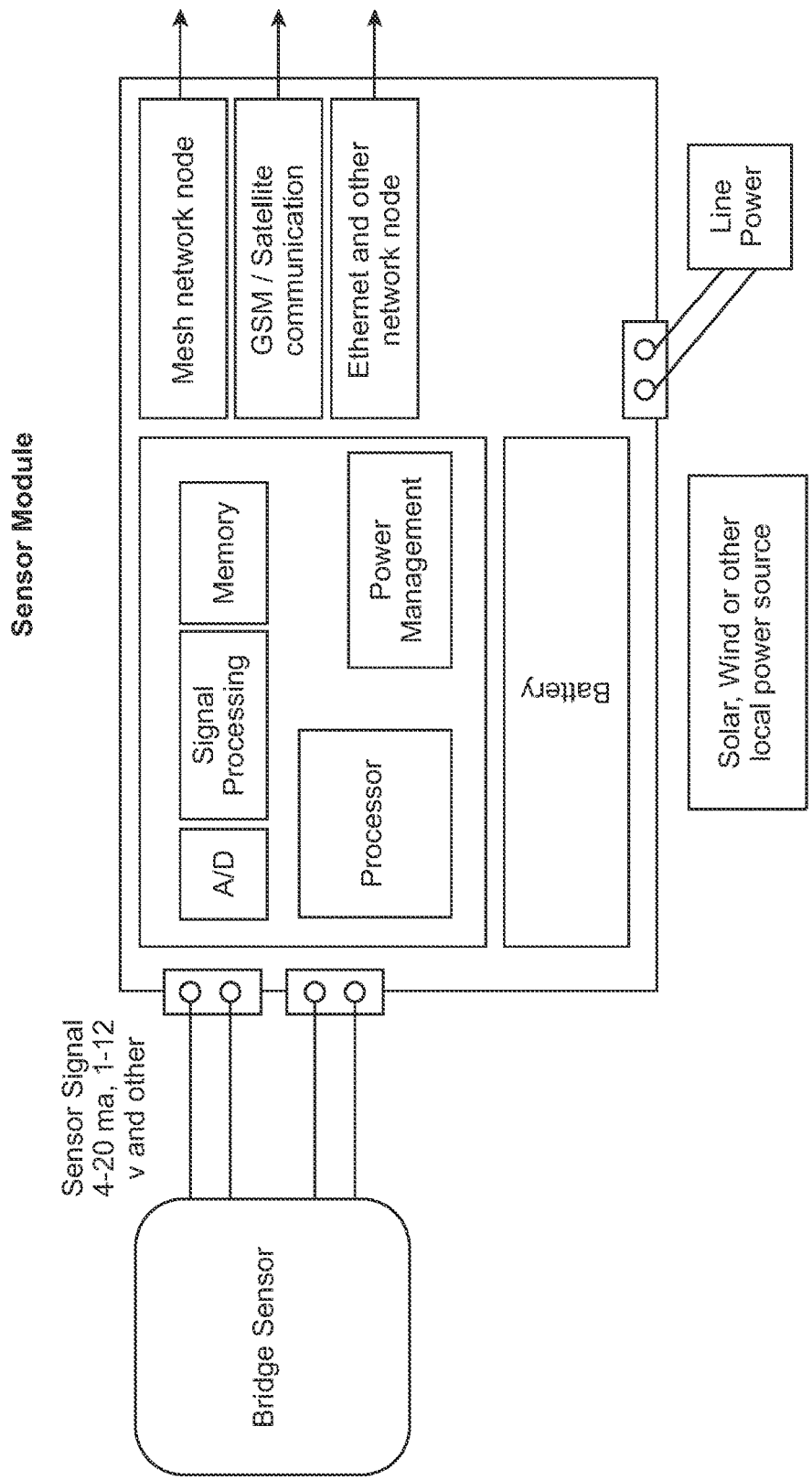
FIG. 4 is a simplified diagram showing an exemplary sensor module.

FIG. 4 Illustrates a single Sensor Module that would connect to various sensors and convert the measurement signal to a digital form, process and filter the signal, provide temporary storage for a set of measurements over time as a buffer, and transmit the signal to the local controller or directly to the central controller using various forms of data transmission. The sensor module could have battery back-up as well as receive power from a local power source or separate power generation unit.

Sensor modules may be modified in various ways to lower transmission bandwidth and storage requirements. Usually, however, the sensor modules will also have an option to allow full transmission of raw data for testing or for other purposes.

Sensor module will usually have the capacity to digitize measurements from a sensor, analyze the digitized data locally (via an on-board processor), identify and select the essential information or data from the digitized data to produce a reduced sensor data set, and then transmit the reduced sensor data set through a wireless or hard-wired link to the local controller, such as a bridge controller. The result will be more efficient use of bandwidth and storage while improving response to issues in the structure such as alarms conditions as described elsewhere herein.

In a specific example, a strain gauge sensor module can be configured to detect a peak strain from the hundreds of data points (typically about 400) measured over the short time period (typically about four seconds) that passage of a truck will stress a monitored bridge structure or component. An accelerometer will measure the change in motion of the structure or component. For example, a measurement cycle will start on an impact or periodic stress on a component or structure. The measurement cycles will be a series of accelerations both positive and negative that will either dampen out or continue as cycle if the stress continues. These accelerations can be sampled many times a second by the accelerometer sensor, and the collected raw data reduced to a set of peak accelerations and duration of the cycle. A count of accelerations over the time period that are above or below certain thresholds and can also be logged.

In a second specific example, a temperature sensor module can monitor the temperature of a bridge structure or component. Temperature is one of the highest stressors on bridge and other structures due to the strain that can be created by different rates of cooling and heating on different components of a structure. The temperature at a point can be sampled and then analyzed to determine if it is changing above a certain value since the temperature was last reported to the control unit. For example if the temperature was recorded as 40.0° F. at 10:00 am and was sampled again at 10:01 as 40.0° F., and the set point for threshold change value was 0.5°, then no transmission of temperature from the temperature sensor module to the control unit or central unit would occur. Sampling would continue as the temperature rises to 40.1 and on to 40.2 over the next 30 minutes with no transmission of temperature. If after 40 minutes, a temperature is measured at 40.6° F., this new temperature would be transmitted since it exceeds the threshold change of 0.5° F. By knowing both the time lapse between temperature transmissions, and the value of the change, the rate of temperature change on the structure or component can be calculated based on a minimum data transmission. This data transmission protocol reduces the amount of total data being transmitted while still providing accurate temperature measurement using knowledge of the type of measurement being taken and the effect on the structure being measured.

Such data transmission protocols can also apply to other measurements critical to a bridge or other structures performance. For example water height of a body of water such as a river below a bridge is an important indicator of floods, and high water flow volumes have an effect on the foundation or other condition of the structure. A water height and flow sensor module have a data transmissions protocol based on rate of change. Water level could be measured periodically but transmitted to the local control unit only when the rate of change in water level was above a set point and/or only when the measured water level exceeded a certain. Using this protocol, water flow and level can be monitored substantially continuously but transmitted to the local control unit only when the preliminary analysis within the module showed potentially dangerous or otherwise significant condition outside the accepted set points and limits was present.

Data transmission protocols can also be employed at the bridge or other local control unit level. By taking measurement data from multiple sensor modules distributed over different locations on the bridge measuring different condition and processing those measurements to reduce the data load to be transmitted to the central unit, e.g. taking measurements and combining them with known characteristics of both the measurement and system being measured, the efficiency of both transmission (use of bandwidth) and long term archiving will be increased. At the local control level, multiple measurements being received from one or multiple sensor modules could be combined to analyze multi-variable effects on structural performance and transmitted as either a measurement or a composite measurement representing a characteristic that would affect a structure or bridge.

For example, scour is a condition affecting a bridge where flowing water removes foundation material resulting in instability in the structure's foundation which could result in the bridge collapsing or being severely compromised and damaged. Using a combination of information sent from multiple sensor modules including accelerometers coupled to the bridge's piers or other foundational supports as well as from sensor modules that measure the height of water under the bridge, the local control unit can calculate a "scour risk indicator." For example if the local control unit defects increasing pier acceleration and movement combined with rising water level it would signal an alarm regarding the risk of scour developing. The scour risk indication would be transmitted as a composite measurement to the central cloud solution.

Another example of a data transmission protocol employed at the bridge or other local control unit level provides load sharing on multiple girders or load bearing elements. The local control unit averages multiple measurements of strain or peak strain from a plurality of sensor modules on different bridge components and analyzes how the elements share the loads due to traffic such as trucks and cars. Over time there should be a consistent sharing distributed over the various elements. If there is a discontinuity in this sharing where one girder either has more peak strain or less than its calculated share it would signal an imbalance in load sharing across the bridge and would be an indicator of potential damage or fatigue of that element or set of elements. This could be transmitted to the central unit as a composite measurement of load sharing rating and could be alarmed for conditions that exceed certain safety thresholds. By proper selection of rate and state information from the sensor modules and performing a multivariable analysis of the bridge structure within the local control unit, one or more reduced data set(s) could be transmitted to the remote central unit which would reduce the amount of data being sent while still providing an accurate measurement of bridge.

A further example of a data transmission protocol employed at the bridge or other local control unit level employs a combination of information from multiple sensor modules, such as the temperature change sensor modes described above, at deployed at multiple points on the bridge. In addition, one or more sensor modules are deployed to measure humidity levels on or near the bridge. The local control unit can be programmed to calculate the risk of icing based on an observed temperature drop in view of the measure humidity. This multivariable calculation by the local control unit allows efficient transmission of bridge icing indicator to the central unit as well as providing information useful for a local alarm.

Figure 5:
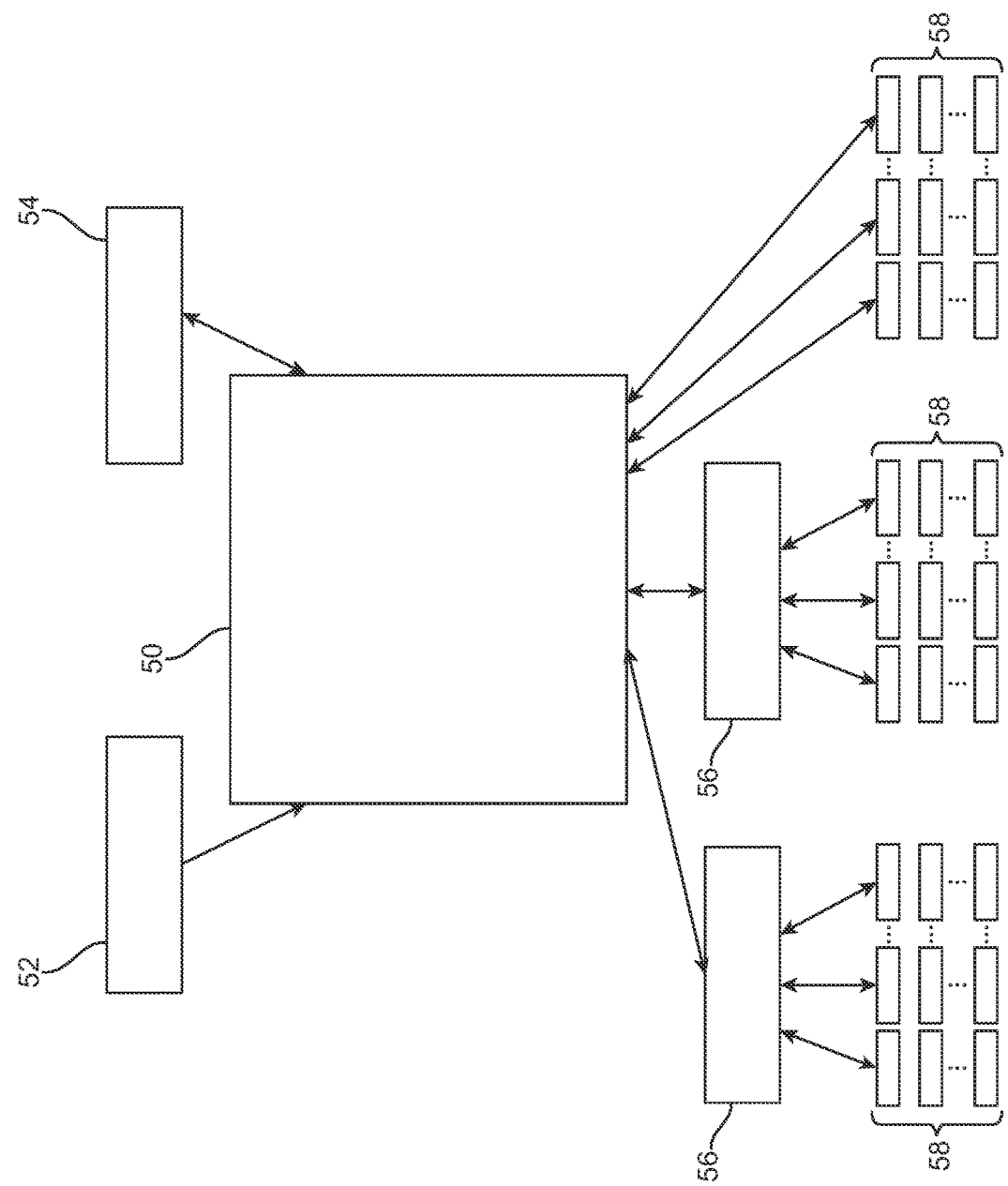
FIG. 5 is a block diagram showing information flow between a remote central control station and various information input sources and local control units that are on multiple bridges.

FIG. 5 illustrates a network of bridges or structures that is being monitored and controlled for performance in accordance with the principles of the present invention comprises, which is configured to receive data from external sources 52, such as databases showing weather, traffic, river water flows, and other information which may affect the operation, safety or other performance factors of the bridge. The remote central monitoring and control station will also be configured to receive input from users 54 regarding scheduling of maintenance, materials and the like. The remote central monitoring and control station will be configured to send and receive data to individual bridges 58 or structures or transportation vehicles. A network of bridges can be monitored and controlled for performance factoring any interaction between bridges (structures) or ways the bridges might be coupled to provide better performance.

Sensor modules can be configured to measure numerous specific structural characteristics, conditions, and events. For example, structural integrity can be assessed based on data from strain gauges coupled to structural components. If the strain and/or the dynamic response exceeds a predetermined limit, an alarm can be triggered. Crack growth can be measured and an alarm sounded is it exceeds allowable amount. Bridge movement can be sensed with a sensor module and an alarm sounded exceeds a set limit due to earthquake, bearing damage or any other cause. Sensor modules with load cells can detect overweight traffic and trigger an alarm. Sensor modules with vibration or other sensors can detect collisions, such as a truck or marine traffic hitting a support and trigger an alarm. Scour of a bridge foundation caused by flowing water along during severe weather and heavy precipitation is another condition that can be detected and trigger an alarm. In all alarm conditions, the local controller can optionally control bridge access, notify police and emergency agencies, and initiate other actions locally without instructions from the central controller. Usually, data concerning the alarm conditions and local actions initiated will be sent to the central controller for archiving and/or analysis.

Sensor modules can also be configured to measure numerous specific environmental and usage events. Bridge icing sensor optionally combined with local precipitation and/or temperature sensors can activate signage warnings of icy and other dangerous conditions. Additionally or alternatively, bridge metering lights and/or speed limits can be adjusted to control traffic. Other bridge management capabilities include monitoring and controlling vehicle flow on bridge in response to particular traffic flow patterns detected by sensors in the roadway, e.g. by stopping or slowing within selected parameters, based on time of day, in response to bridge strain indicating excessive load on bridge, and the like. Other bridges in area monitored for traffic flow indicating other bridges available without traffic. Signals can be sent to autonomous vehicles or navigation systems in cars to reroute traffic.

Sensors and intelligent sensor modules could be programmed to "listen" or detect for a changing audible level and signature detected indicating a collision or accident. The sensor module or bridge controller could then analyze the data and send an alarm and authorities notified to respond while also acting in real time to close the bridge or reroute traffic through a bridge fleet management system.

Sensor modules working with a bridge controller could sense intrusion detected on bridge structure indicating abnormal behavior. Suitable sensors for movement or intrusion include light beam disruption sensors and video surveillance monitors. Once intrusion is detected the bridge controller would be able to initiate an audible or other type of alarm at the bridge together with sending an alarm to authorities.

Sensor modules could monitor light levels to detect degradation in bridge level of lighting measured indicating required maintenance on lights to assure good visibility and safety. A signal including light degradation status and/or quantitative light levels would be sent to the central unit for monitoring in the cloud where authorities would be able to receive and/or send alarms and notification of lightening levels. These data could then be utilized to develop a maintenance plan for one or several bridges in a more productive sequence or schedule.

Sensor modules can work with the local control unit of a bridge to sense abnormal temperature gradient(s) when combined with knowledge of the bridge environment can indicate a fire. Such fire detection can trigger a control sequence at the bridge, e.g. the release of fire suppression chemicals. Simultaneously, an alarm could be sent to the cloud management system and authorities notified.

Sensor modules combined with the local bridge or other control unit could measure, collect, and send to the cloud levels of various environmental states including temperature and chemical levels associated with pollution for short term and long term pollution monitoring on bridge. These levels could be analyzed and correlated with all bridges in region indicating pollution levels and changes in pollution levels. Changes in pollution levels could be analyzed across bridges and modified for changing traffic patterns versus macro-changes in the environment.

Bridge structural sensors for a day, week, month, year are reviewed against a model to determine actual bridge life and number of cycles that the bridge has been exposed. Data used to predict remaining useful life based on actual bridge usage and bridge performance under this level of use. Using data engineering design of maintenance to effectively increase the life of the bridge based on known structural performance and comparison to a model.

Each specific bridge could be analyzed on an ongoing basis and an adaptive model and algorithms be used to model the structural performance of the bridge and how it is changing. In fact this becomes a learning bridge performance monitoring system as it analyses data over time and determines changes in dynamic and static responses to input or forces on the bridge. For example daily temperature changes could cause a different bridge signature for the same temperature as the bridge deteriorates or a change such as the impact of a truck on a support beam was induced.

In addition information from a network of bridges or a set of many bridges could be analyzed on an ongoing basis and an adaptive model and algorithms be used to model the structural performance of the set of bridges and how they are changing as similar structures or changing in different ways to various known inputs. A life cycle analysis could also be made from a set of bridges that are in different phases of life cycle and how predictions on performance could be made using information and analysis of a set of bridges that is shared.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that the methods and structures within the scope of these claims and their equivalents be covered thereby:

What is claimed is:

1. A bridge monitoring system comprising
   a plurality of sensor modules configured to be distributed on or near a bridge, said sensor modules each including a sensor which senses a bridge performance characteristic and generates raw sensor data relevant to a bridge structure or an environmental condition , a power source, and a communications component, wherein at least some of the sensor modules further include a processor configured to receive the sensor data from the sensor, to select data most relevant to bridge performance and to exclude other data less relevant to bridge performance to generate a selected data set, and to transmit the selected data set, wherein the sensor modules transmit the selected data set only after a change between a first value in the selected data and a second value in the selected data has occurred which exceeds a threshold amount;
   at least one local control unit configured (1) to be located on or near the bridge and to receive the selected data set transmitted from at least some of the plurality of sensor modules, (2) to process the selected data sets received from the at least some of the plurality of sensor modules to generate processed data, and (3) to transmit the processed data sets; and
   a remote central unit configured to receive processed data transmitted from the local control unit.

2. The system as in claim 1, wherein the sensor modules include a sensor, a power source, and a communications component.

3. The system as in claim 2, wherein at least some of the sensor modules further include a processor configured to receive data from the sensor and generate a reduced data set including selected data relating to bridge performance and excluding other data less relevant to bridge performance.

4. The system as in claim 3, wherein the sensor is a strain gauge configured to be coupled to a bridge component and to monitor stress of that bridge component at a rate of a plurality of data points per second wherein the processor is programmed to detect one or more peak stress data points during a fixed time window and to transmit one or more of said selected peak data point(s) to the local control unit.

5. The system as in claim 3, wherein the sensor is a temperature sensor that periodically measures a temperature related to the bridge, wherein the sensor module transmits a measured temperature to the local control unit only after a threshold change in the measured temperature has occurred.

6. The system as in claim 5, wherein the threshold change has a value in a range from 0.1° C. to 1° C.

7. The system as in claim 5, wherein the local control unit includes a processor configured to calculate a rate of temperature change based on a value of the temperature threshold change and a time elapsed for the temperature change to occur.

8. The system as in claim 1, wherein the local control unit includes a processor.

9. The system as in claim 8, wherein the processor in the local control unit processes data received from the sensor modules to generate a reduced data set and transmits the reduced data set to the central unit.

10. The system as in claim 8, wherein the processor in the local control unit processes data sets from two or more sensor modules and determines a bridge status based on the data sets from the two or more sensor modules.

11. The system as in claim 1, wherein the central unit is a virtual unit residing in a remote database.

12. The system as in claim 1, wherein the central unit resides on a remote dedicated server.

13. A method for monitoring a bridge, said method comprising
providing a bridge monitoring system comprising:
(a) a plurality of sensor modules distributed on or near a bridge, said sensor modules each including a sensor which senses a bridge performance characteristic and generates raw sensor data relevant to a bridge structure or an environmental condition a power source, and a communications component, wherein at least some of the sensor modules further include a processor configured to receive the sensor data from the sensor, to select data most relevant to bridge performance while excluding other data less relevant to bridge performance to generate a selected data set, and to transmit the selected data set only after a change between a first value in the selected data and a second value in the selected data has occurred which exceeds a threshold amount;
(b) at least one local control unit located on or near the bridge, said at least one local control unit configured to (1) receive the selected data set transmitted from at least some of the plurality of sensor modules, (2) to process the selected data set received from the at least some of the plurality of sensor modules to generate processed data, and (3) to transmit the processed data set: and
(c) a remote central unit configured to receive the processed data set transmitted from the local control unit:
receiving data from the plurality of sensor modules distributed on or near the bridge in the at least one local control unit;
processing the received data in the local control unit located on or near the bridge; and
transmitting selected data from the processed data from the local control unit to the remote central unit located remotely from the bridge only after a change between a first value in the selected data and a second value in the selected data has occurred which exceeds a threshold amount.

14. The method as in claim 13, further comprising selecting data most to bridge performance and excluding other data less relevant to bridge performance in the processor to produce a reduced data set.

15. The method as in claim 14, wherein the sensor is a strain gauge configured to be coupled to a bridge component and to monitor stress of that bridge component at a rate of at least 100 data points per second, further comprising detecting one or more peak stress data points during a window of one second to six seconds and transmitting said one or more selected peak data point(s) to the local control unit.

16. The method as in claim 14, wherein the sensor is an accelerometer configured to be coupled to a bridge component and to monitor movement of that bridge component at a rate of a plurality of data points per second, further comprising detecting one or more peak acceleration or movement data points during a fixed time window and transmitting said one or more selected peak data point(s) to the local control unit.

17. The method as in claim 16, wherein the local control unit indicates a processor, further comprising calculating a rate of temperature change based on a value of the temperature threshold change and a time elapsed for the temperature change to occur.

18. The method as in claim 17, further comprising processing data received from the sensor modules in the processor of the local control unit to generate a reduced data set and transmitting the reduced data set to the central unit.

19. The method as in claim 17, further comprising processing data sets from two or more sensor modules in the processor of the local control unit and determining a bridge status based on the two or more data sets.

20. The method as in claim 14, wherein the sensor is a temperature sensor further comprising periodically measuring a temperature related to the bridge, wherein the sensor module transmits a measured temperature to the local control unit only after a threshold change in the measured temperature has occurred.

21. The method as in claim 20, wherein the threshold change has a Value from 0.1° C. to 1° C.

22. The method as in claim 13, wherein the local control unit includes a processor.

23. The method as in claim 13, wherein the central unit is a virtual unit residing in a remote database.

24. The method as in claim 13, wherein the central unit resides on a remote dedicated server.

* * * * *